United States Patent
Leu et al.

(10) Patent No.: US 7,816,011 B2
(45) Date of Patent: Oct. 19, 2010

(54) STRUCTURAL MATERIAL OF DIAMOND LIKE CARBON COMPOSITE LAYERS

(75) Inventors: Ming-Sheng Leu, Hsinchu County (TW); Jin-Bao Wu, Hsinchu (TW); Jia-Jen Chang, Yunlin County (TW)

(73) Assignee: Industrial Technology Research Institute, Hsinchu (TW)

( * ) Notice: Subject to any disclaimer, the term of this patent is extended or adjusted under 35 U.S.C. 154(b) by 129 days.

(21) Appl. No.: 12/046,455

(22) Filed: Mar. 12, 2008

(65) Prior Publication Data

US 2009/0169845 A1 Jul. 2, 2009

(30) Foreign Application Priority Data

Dec. 28, 2007 (TW) .............................. 96151043 A

(51) Int. Cl.
*B32B 9/00* (2006.01)
(52) U.S. Cl. .................. 428/408; 428/457; 428/698
(58) Field of Classification Search ......... 428/212–217, 428/336, 408, 411.1, 457, 688, 689, 697–699, 428/704; 427/249.7; 204/192.38
See application file for complete search history.

(56) References Cited

U.S. PATENT DOCUMENTS 5,031,029 A * 7/1991 Acocella et al. ............. 257/712
6,083,570 A * 7/2000 Lemelson et al. ........... 427/554
6,197,438 B1 * 3/2001 Faulkner ..................... 428/627
2007/0141383 A1 * 6/2007 Chen .......................... 428/627

OTHER PUBLICATIONS

Xia et al., Effects of intermediate layers on the tribological behavior of DLC coated 2024 aluminum alloy, Wear 257, No month 2004, pp. 599-605.*

A.A. Voevodin, S.D. Walck, J.S. Zabinski / Architecture of multilayer nanocomposite coatings with super-hard diamond-like carbon layers for wear protection at high cotact loads / Wear 203-204 (1997) 516-527 / Elsevier Science S.A.

* cited by examiner

*Primary Examiner*—Timothy M Speer
(74) *Attorney, Agent, or Firm*—Jianq Chyun IP Office

(57) ABSTRACT

A structural material of diamond like carbon (DLC) composite layers is provided. The structural material includes a composite material which is consisted of a metal layer, a first metal nitride layer, and a DLC thin film. The metal layer includes aluminum (Al), copper (Cu), zirconium (Zr), nickel (Ni), or vanadium (V). The first metal nitride layer includes aluminum nitride (Al—N), zirconium nitride (Zr—N), vanadium nitride (V—N), or nickel nitride (Ni—N). The DLC thin film of the structural material of DLC composite layers has high quality tetragonally bonded amorphous carbon (ta-C) with a $sp^3$(C—C) bonding ratio of more than 30%. Therefore, it is suitable for the work pieces in the mechanical, chemical, electricity, photoelectric, and heat transfer fields.

18 Claims, 7 Drawing Sheets

STRUCTURAL MATERIAL OF DIAMOND LIKE CARBON COMPOSITE LAYERS

CROSS-REFERENCE TO RELATED APPLICATION

This application claims the priority benefit of Taiwan application serial no. 96151043, filed on Dec. 28, 2007. The entirety the above-mentioned patent application is hereby incorporated by reference herein and made a part of specification.

BACKGROUND OF THE INVENTION

1. Field of the Invention

The present invention generally relates to a structural material of diamond like carbon (DLC) composite layers and a method of manufacturing the same.

2. Description of Related Art

Diamond like carbon (DLC) thin films have attracted considerable attentions in the last decade, mainly because the DLC thin films have high hardness, high Young's modulus, high abrasive resistance, high thermal conductivity, low friction coefficient, and chemical inertness. By means of property adjustment through such a surface modification, the DLC thin films are applied to various precision work pieces and elements to improve and promote the mechanical performance of the surfaces, and thus the surfaces of the work pieces and products have the special properties similar or close to those of diamond, so as to improve the mechanical performance of the work pieces. The DLC thin films are further applied in severer environment or requirements without reducing the working life, thereby significantly improving the performance of the products and increasing the value of the products.

Although the DLC thin films have excellent properties, during film coating, the surface of the film layer is bombed by coating particles continuously, and thus residual stress is generated inevitably during coating the DLC thin films. Accordingly, excessively high residual stress will cause cracks in the layers, thus decreasing the adhesion of the DLC thin films.

Further, due to the sensitivity of the DLC thin film to environment and the low adhesion caused by the diffusion of interface stress between the DLC thin film and a substrate, the application of the DLC thin film is limited extremely. Therefore, the current technique relates to adding a special intermediate interface layer or adding elements capable of reducing the internal stress of the film into the DLC thin film, so as to improve the structural strength of the DLC thin film and the adhesion between the film and the substrate.

FIG. 1 is a schematic cross-sectional view of a conventional DLC multiple coatings. A Ti layer 102, a TiN layer 104, a TiCN layer 106, a TiC layer 108, and a DLC thin film 110 are coated in sequence on a surface of a substrate 100. In FIG. 1, materials such as Ti/TiN/TiCN are used as the intermediate layers between the substrate 100 and the DLC thin film 110, thus the difference in the lattice constants and thermal expansion coefficients between the substrate 100 and the DLC thin film 110 can be adjusted simultaneously, so as to decrease the internal stress of the film.

However, during coating the DLC thin film, when the ratio of $sp^3$ diamond structure of the manufactured DLC thin film is improved higher, the internal stress of the film is easily increased, thus fragmentation automatically occurs. Additionally, during coating the DLC thin film and compositing with another substrate, due to the high-ratio diamond structure of the film and the poor adhesion between the film and the substrate, film removal likely occurs.

SUMMARY OF THE INVENTION

Accordingly, the present invention is directed to a structural material of DLC composite layers, capable of significantly improving the adhesion between the DLC thin film and a substrate.

The present invention is further directed to a method of manufacturing a structural material of DLC composite layers, capable of improving a ratio of the $sp^3$ diamond structure of the DLC thin film, so as to avoid the fragmentation of the structural material of DLC composite layers.

The present invention is further directed to a structural material of DLC composite layers, having a high quality tetragonally bonded amorphous carbon (ta-C) structure with a $sp^3$(C—C) bonding ratio more than 30%, and applicable to work pieces in the mechanical, chemical, electricity, photoelectric, and heat transfer fields.

The present invention is further directed to a method of manufacturing a structural material of DLC composite layers, capable of manufacturing a DLC thin film having a high quality tetragonally bonded amorphous carbon (ta-C) structure, so as to be applied to work pieces in the mechanical, chemical, electricity, photoelectric, and heat transfer fields.

The present invention provides a structural material of DLC composite layers, which includes a composite material consisted of a metal layer, a first metal nitride layer, and a DLC thin film. The metal layer includes aluminum (Al), copper (Cu), zirconium (Zr), nickel (Ni), or vanadium (V). The first metal nitride layer includes aluminum nitride (Al—N), zirconium nitride (Zr—N), vanadium nitride (V—N), or nickel nitride (Ni—N).

The present invention further provides a method of manufacturing a structural material of DLC composite layers, which includes preparing a composite material consisted of a metal layer, a first metal nitride layer, and a DLC thin film on a substrate by using graphite and a metal target material through physical vapor deposition, in which the metal layer includes aluminium (Al), copper (Cu), zirconium (Zr), nickel (Ni), or vanadium (V), and the first metal nitride layer includes aluminum nitride (Al—N), zirconium nitride (Zr—N), vanadium nitride (V—N), or nickel nitride (Ni—N).

The present invention further provides a structural material of DLC composite layers, which includes a composite material consisted of a metal nitride layer and a DLC thin film. The metal nitride layer includes aluminum nitride (Al—N), zirconium nitride (Zr—N), vanadium nitride (V—N), or nickel nitride (Ni—N).

The present invention further provides a method of manufacturing a structural material of DLC composite layers, which includes preparing a composite material consisted of a metal nitride layer and a DLC thin film on a substrate by using graphite and a metal target material through physical vapour deposition, in which the metal nitride layer includes aluminum nitride (Al—N), zirconium nitride (Zr—N), vanadium nitride (V—N), or nickel nitride (Ni—N).

The present invention has composite layers having lattice constants well matching the lattice constant of the DLC and disposed between the substrate and the DLC thin film, and thus a structural material of DLC composite layers having a high diamond ratio can be prepared. The structural material of DLC composite layers is applicable to work pieces in the mechanical, chemical, electricity, photoelectric, and heat transfer fields for surface modification processing.

In order to make the features and advantages of the present invention more clear and understandable, the following embodiments are illustrated in detail with reference to the appended drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
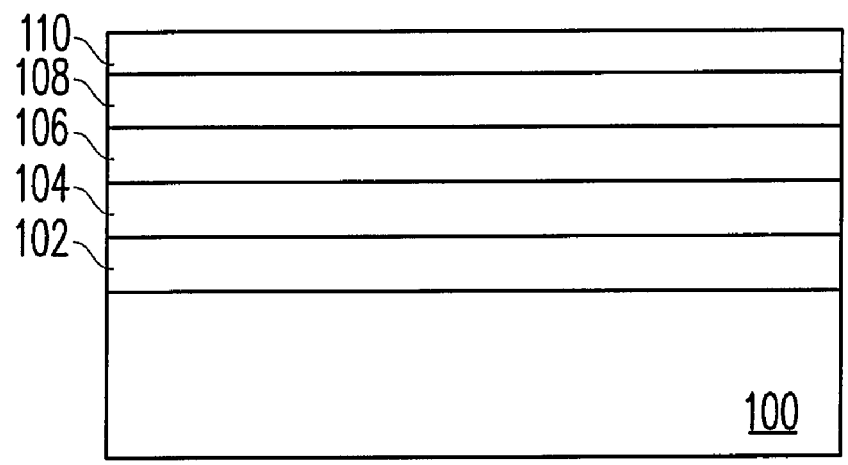
FIG. 1 is a schematic cross-sectional view of a conventional DLC multiple coatings.

Reference will now be made in detail to the present embodiments of the invention, examples of which are illustrated in the accompanying drawings. Wherever possible, the same reference numbers are used in the drawings and the description to refer to the same or like parts.

Hereinafter, the present invention is illustrated in detail with reference to the following drawings which show embodiments of the present invention. However, the present invention can further be implemented in various manners and should not be limited to the embodiments hereinafter. In practice, the embodiments are provided merely to disclose the present invention more detailed and complete, and to transfer the scope of the present invention to those of ordinary skill in the art completely. In the drawings, the sizes of layers and the relevant sizes may be exaggerated for clarity.

Figure 2:
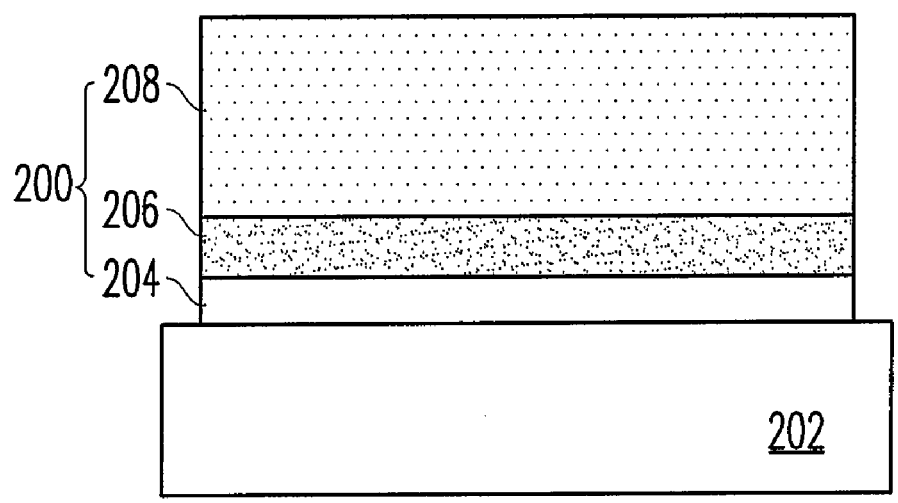
FIG. 2 is a schematic cross-sectional view of a structural material of DLC composite layers according to a first embodiment of the present invention.

FIG. 2 is a schematic cross-sectional view of a structural material of DLC composite layers according to a first embodiment of the present invention.

Referring to FIG. 2, the structural material of DLC composite layers of the first embodiment includes a single layer of composite material 200. The composite material 200 can be formed on a substrate 202. The substrate 202 can be a metal substrate or a non-metal substrate. The composite material 200 is consisted of a metal layer 204, a first metal nitride layer 206, and a DLC thin film 208. The metal layer 204 includes aluminum (Al), copper (Cu), zirconium (Zr), nickel (Ni), or vanadium (V). The first metal nitride layer 206 includes aluminum nitride (Al—N), zirconium nitride (Zr—N), vanadium nitride (V—N), or nickel nitride (Ni—N). In the first embodiment, the DLC thin film 208 in the composite material 200 includes pure carbon or a tetragonally bonded amorphous carbon (ta-C) structure containing less than 10% of hydrogen atom, nitrogen atom, or metal atom. Further, thicknesses of the metal layer 204 and the first metal nitride layer 206 in the composite material 200 are, for example, approximately 20 nm-100 nm. A thickness of the DLC thin film 208 is, for example, 100 nm-10 μm.

Figure 3:
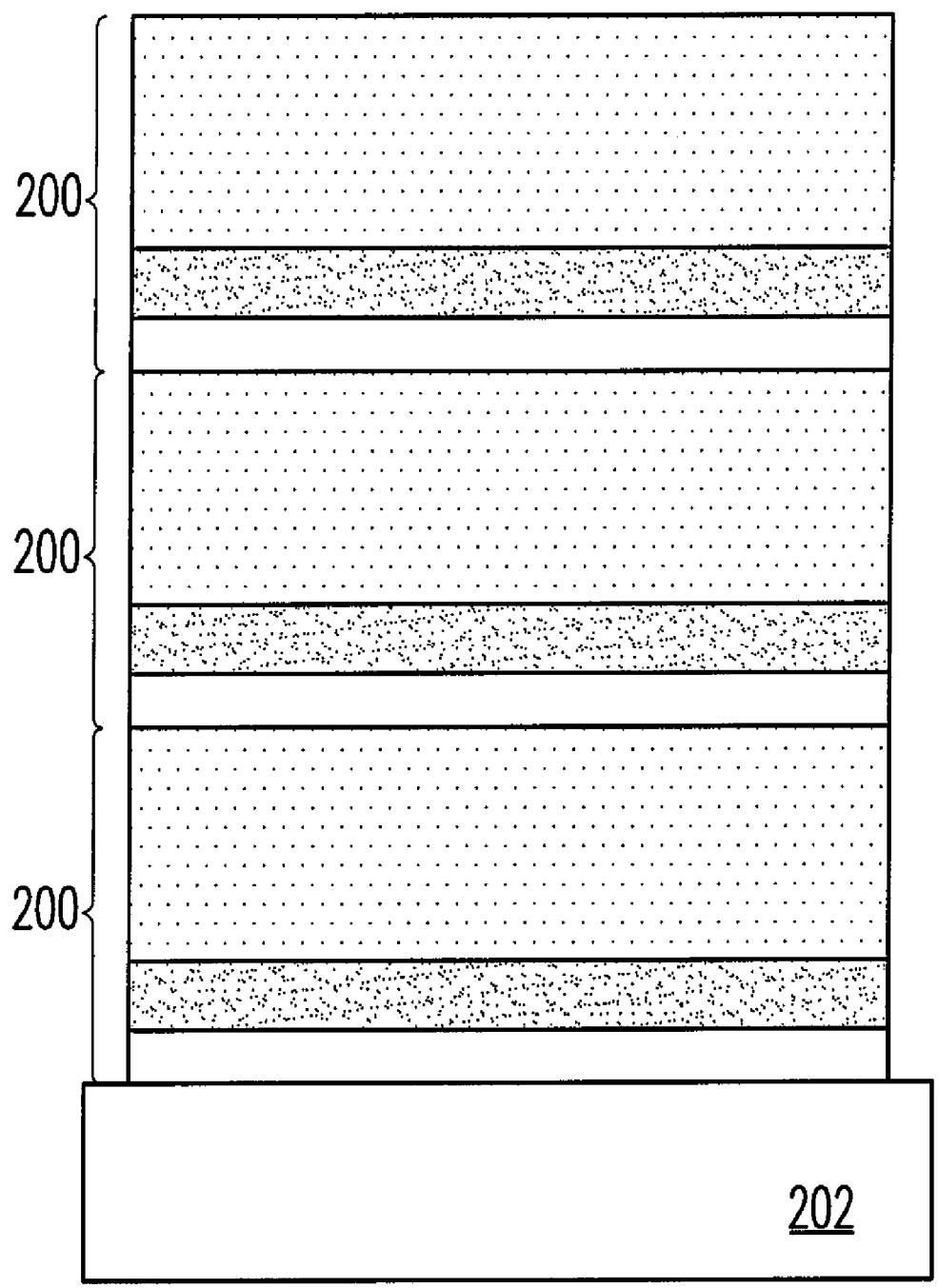
FIG. 3 is a schematic cross-sectional view of a first variation of the first embodiment.

FIG. 3 is a schematic cross-sectional view of a first variation of the first embodiment, in which identical reference numerals are used to mark identical or similar elements as those in the first embodiment. Referring to FIG. 3, the structural material of DLC composite layers in the variation includes multiple layers of composite material 200.

Figure 4:
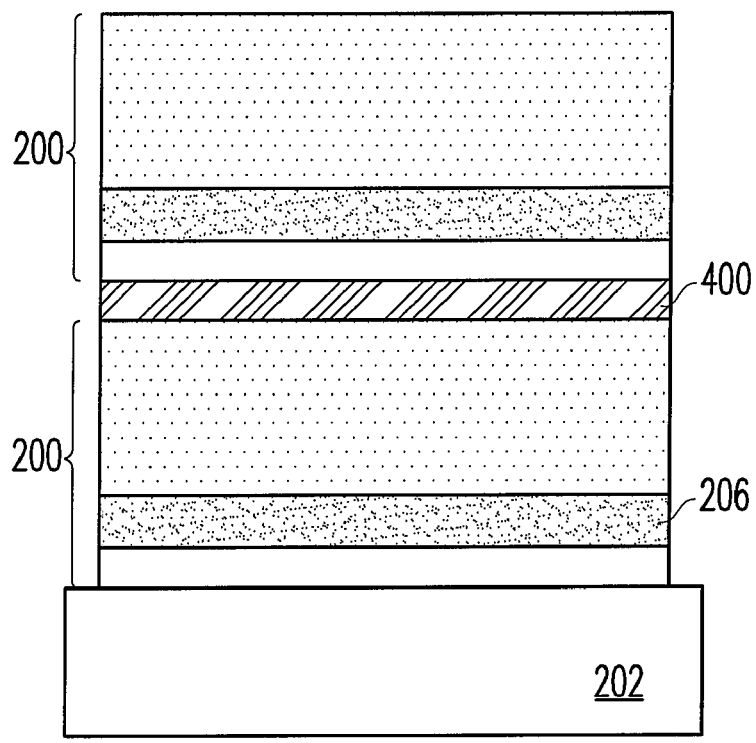
FIG. 4 is a schematic cross-sectional view of a second variation of the first embodiment.

FIG. 4 is a schematic cross-sectional view of a second variation of the first embodiment, in which identical reference numerals are used to mark identical or similar elements as those in the first embodiment. Referring to FIG. 4, the structural material of DLC composite layers in the variation not only has multiple layers of composite material 200, but also has a second metal nitride layer 400 between the composite materials 200. For example, the second metal nitride layer 400 includes aluminum nitride (Al—N), zirconium nitride (Zr—N), vanadium nitride (V—N), or nickel nitride (Ni—N). A thickness of the second metal nitride layer 400 is, for example, 20 nm-100 nm. Further, the second metal nitride layer 400 and the first metal nitride layer 206 can be made of identical or different materials.

Figure 5:
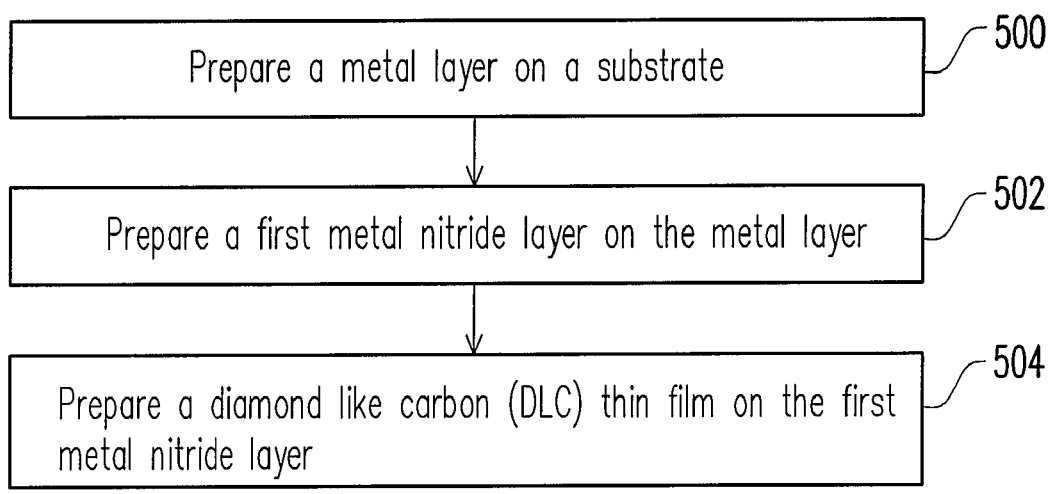
FIG. 5 is a flow chart of process of a method of manufacturing a structural material of DLC composite layers according to a second embodiment of the present invention.

FIG. 5 is a flow chart of process of a method of manufacturing a structural material of DLC composite layers according to a second embodiment of the present invention.

Referring to FIG. 5, the manufacturing method of the second embodiment is performed by using graphite and a metal target material through a physical vapour deposition. The physical vapour deposition can be vacuum sputtering, pulsed laser deposition or arc ion evaporation. For example, in a vacuum chamber, a target material is dissociated through the arc ion evaporation, and an appropriate negative bias is applied onto the substrate, so as to introduce the atoms or ions dissociated from the target material to the substrate to be deposited, and at the same time, an inert gas is charged as a reacting gas. First, in Step 50, a metal layer is prepared on a substrate, and the metal layer includes aluminum (Al), copper (Cu), zirconium (Zr), nickel (Ni), or vanadium (V). Next, in Step 502, a first metal nitride layer is prepared on the metal layer, and the first metal nitride layer includes aluminum nitride (Al—N), zirconium nitride (Zr—N), vanadium nitride (V—N), or nickel nitride (Ni—N). And then, in Step 504, a DLC thin film is prepared on the first metal nitride layer. The metal layer, the first metal nitride layer, and the DLC thin film form a composite material. During Steps 500-504, a temperature of the substrate is preferably controlled in the range of 20° C. to 300° C. for film forming. Especially, when forming a film at a low temperature (<100° C.), a high quality structural material of DLC composite layers is obtained. Taking the composite material having a metal layer of an aluminum (Al) layer and the first metal nitride layer of an aluminum nitride (Al—N) layer as an example, the resistance is up to more than $10^7$ ohm/□ measured by a four-point probe.

Figure 6:
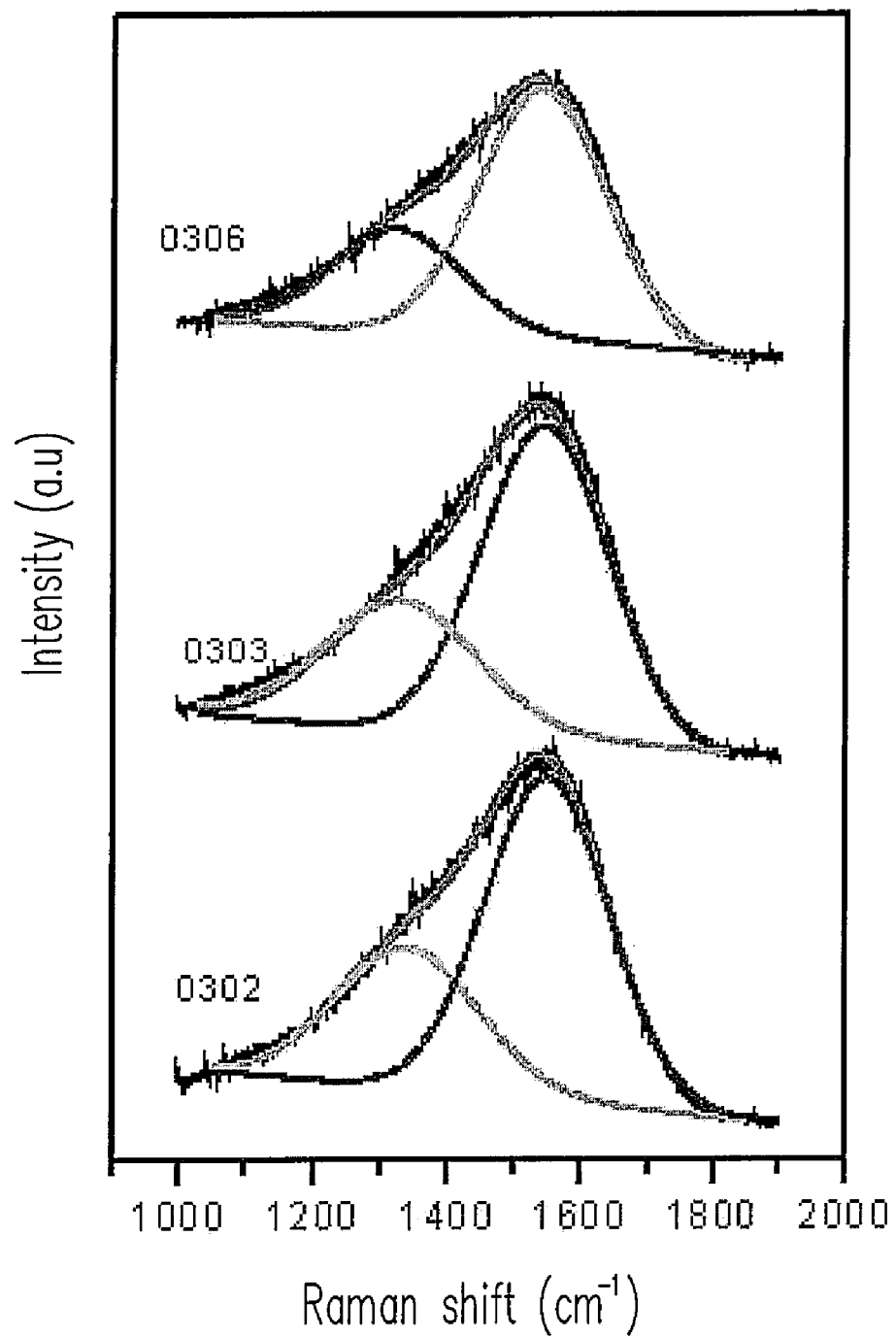
FIG. 6 is an analysis chart of Raman spectrum of the structural material of DLC layers according to the second embodiment.
Figure 7:
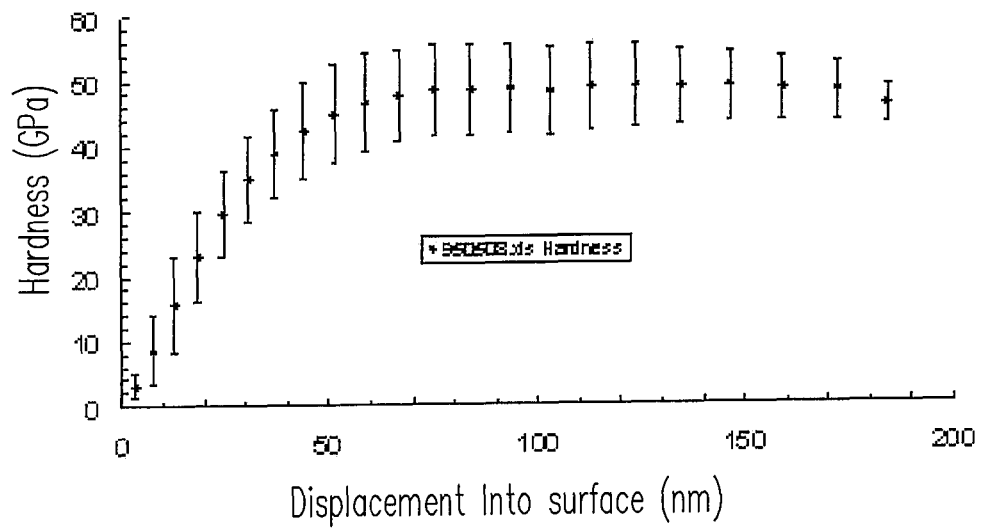
FIG. 7 is a nano hardness measurement and analysis curve of the structural material of DLC layers according to the second embodiment.
Figure 8:
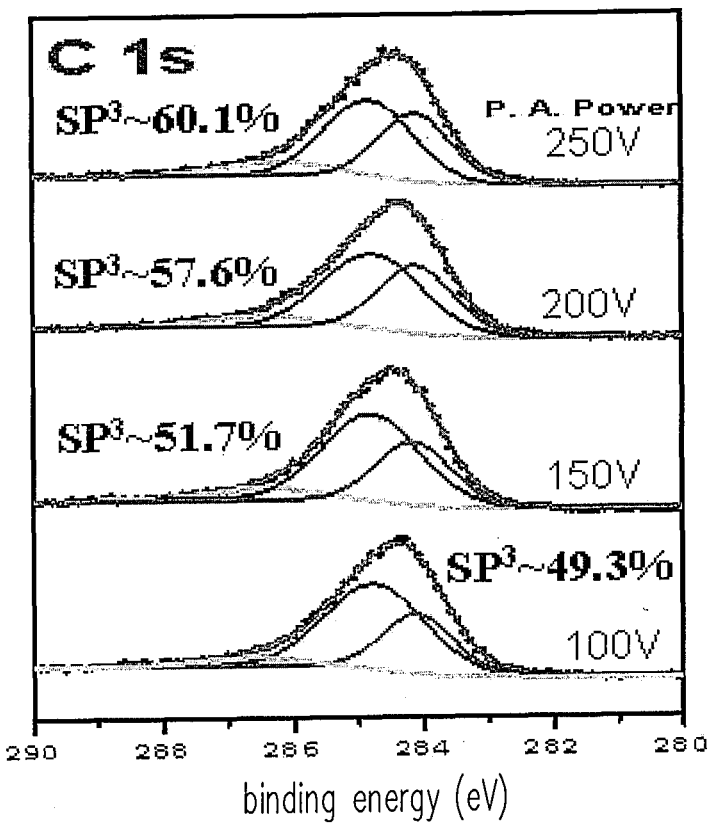
FIG. 8 is an X-ray photoelectron spectroscopy (XPS) of an experiment according to the second embodiment.

The following experimental results of the second embodiment mainly analyze the structural material of DLC composite layers (having the metal layer of an aluminum layer and the first metal nitride layer of an aluminum nitride layer) manufactured through arc ion evaporation. FIG. 6 is an analysis chart of Raman spectrum, FIG. 7 is a nano hardness measurement and analysis curve, and FIG. 8 is an X-ray photoelectron spectroscopy (XPS). It can be confirmed from FIG. 6 that, a high $sp^3$ fraction structural material of DLC composite layers can be obtained according to the second embodiment. It can be confirmed from FIG. 7 that, a structural material of DLC composite layers having a high hardness measurement value up to about 50 GPa can be obtained according to the second embodiment. It an be confirmed from FIG. 8 that, the content of $sp^3$ in the resultant structural material of DLC composite layers obtained according to the second embodiment can be up to more than 60%.

Additionally, the lattice constant of pure diamond structure $-sp^3$ is 3.57 Å. The experimental results of the second embodiment are obtained by using the aluminum (Al, with a lattice constant of ~4.05 Å) layer and an aluminum nitride (AlN, with a lattice constant of ~3.11 Å) layer as the metal layer and the first metal nitride layer in the composite material. Particularly, the aluminum nitride has a lattice constant better matching the lattice constant of the pure diamond structure $-sp^3$, than the conventional interface layer material, including, for example, chromium (Cr, with a lattice constant of ~2.88 Å), chromium nitride (CrN, with a lattice constant of ~4.16 Å), titanium (Ti, with a lattice constant of ~2.95 Å), titanium nitride (TiN, with a lattice constant of ~4.24 Å), and titanium carbon nitride (TiCN, with a lattice constant of ~4.24 Å).

Figure 9:
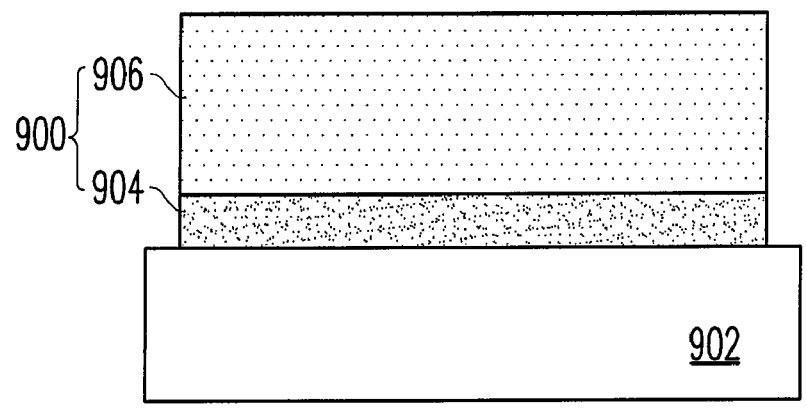
FIG. 9 is a schematic cross-sectional view of a structural material of DLC composite layers according to a third embodiment of the present invention.

FIG. 9 is a schematic cross-sectional view of a structural material of DLC composite layers according to a third embodiment of the present invention.

Referring to FIG. 9, the structural material of DLC composite layers of the third embodiment includes a single layer of composite material 900. The composite material 900 can be formed on a substrate 902. The substrate 902 can be a non-metal substrate. The composite material 900 is consisted of a metal nitride layer 904 and a DLC thin film 906. The metal nitride layer 904 includes aluminum nitride (Al—N), zirconium nitride (Zr—N), vanadium nitride (V—N), or nickel nitride (Ni—N). In the third embodiment, the DLC thin film 906 in the composite material 900 includes pure carbon or a tetragonally bonded amorphous carbon (ta-C) structure containing less than 10% of hydrogen atom, nitrogen atom, or metal atom. Further, a thickness of the metal nitride layer 904 in the composite material 900 is, for example, 20 nm-100 nm. A thickness of the DLC thin film 906 is, for example, 100 nm-10 μm.

Figure 10:
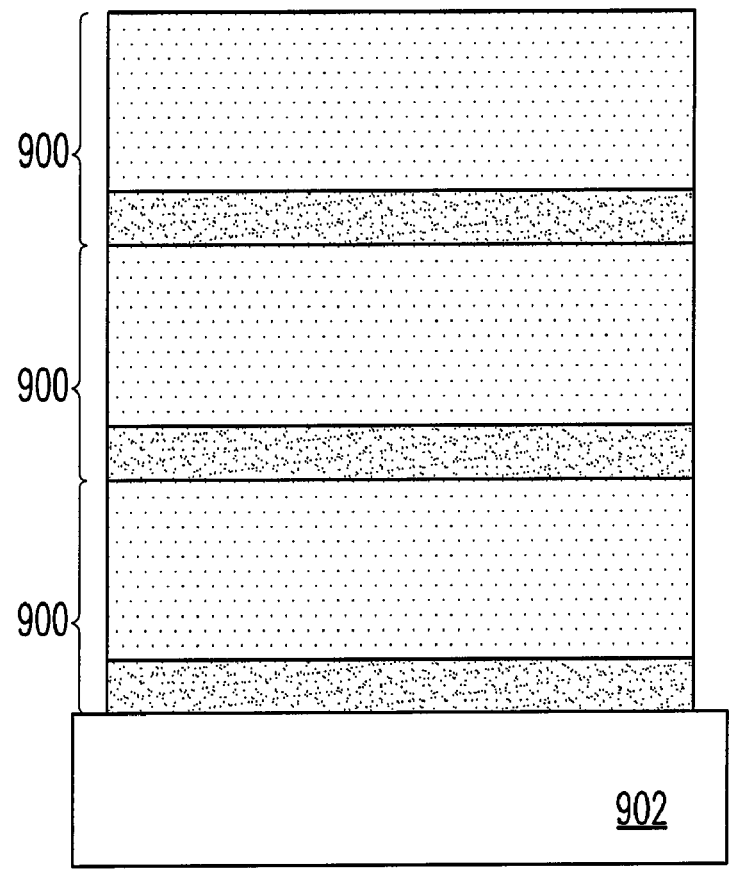
FIG. 10 is a schematic cross-sectional view of a first variation of the third embodiment.

FIG. 10 is a schematic cross-sectional view of a first variation of the third embodiment, in which identical reference numerals are used to mark identical or similar elements as those in the third embodiment. Referring to FIG. 10, the structural material of DLC composite layers in the variation includes multiple layers of composite material 900.

Figure 11:
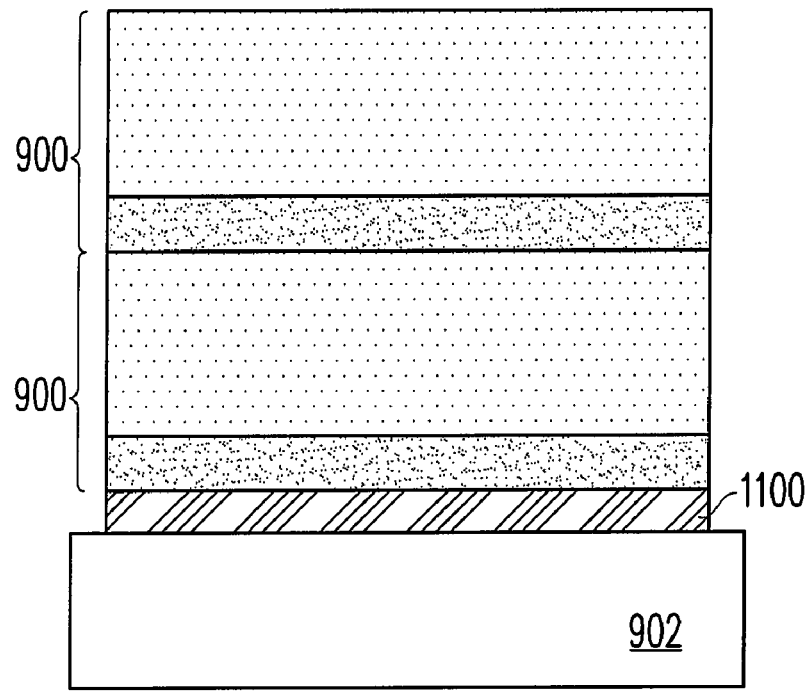
FIG. 11 is a schematic cross-sectional view of a second variation of the third embodiment.

FIG. 11 is a schematic cross-sectional view of a second variation of the third embodiment, in which identical reference numerals are used to mark identical or similar elements as those in the third embodiment. Referring to FIG. 11, the structural material of DLC composite layers in the variation not only has multiple layers of composite material 900, but when the substrate 902 is a metal substrate, the structural material of DLC composite layers also has a metal layer 1100 between the composite material 900 and the metal substrate 902. The metal layer 1100 includes aluminum (Al), copper (Cu), zirconium (Zr), nickel (Ni), or vanadium (V). Further, a thickness of the metal layer 1100 is, for example, 20 nm-100 nm.

Figure 12:
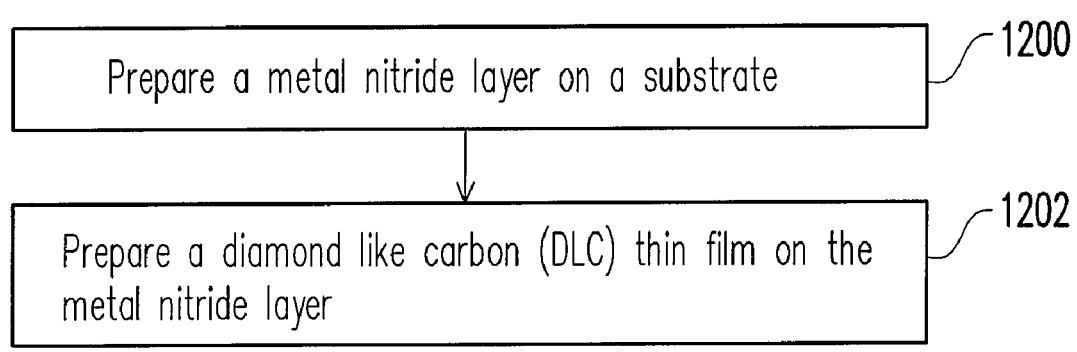
FIG. 12 is a flow chart of processes of manufacturing a structural material of DLC composite layers according to a fourth embodiment of the present invention.

FIG. 12 is a flow chart of processes of manufacturing a structural material of DLC composite layers according to a fourth embodiment of the present invention.

Referring to FIG. 12, the manufacturing method of the fourth embodiment is performed by using graphite and a metal target material through physical vapour deposition. The physical vapour deposition can be vacuum sputtering, pulsed laser deposition or arc ion evaporation. For example, in a vacuum chamber, a target material is dissociated through arc ion evaporation, and an appropriate negative bias is applied onto the substrate, so as to introduce the atoms or ions dissociated from the target material to the substrate to be deposited, and at the same time, an inert gas is charged as a reacting gas. First, in Step 1200, a metal nitride layer including aluminum nitride (Al—N), zirconium nitride (Zr—N), vanadium nitride (V—N), or nickel nitride (Ni—N) is prepared on a substrate. Next, in Step 1202, a DLC thin film is prepared on the metal nitride layer. The metal nitride layer and the DLC thin film form a composite material. During Steps 1200-1202, a temperature of the substrate is preferably controlled in a range of 20° C. to 300° C. for film forming.

In view of the above, the present invention is characterized in that a film having a lattice constant well matching the lattice constant of the DLC is disposed between the substrate and the DLC thin film, thus a structural material of DLC composite layers having a high diamond ratio structure can be manufactured. The structural material of DLC composite layers is suitable to be applied to work pieces in the mechanical, chemical, electricity, photoelectric, and heat transfer fields.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A structural material of diamond like carbon (DLC) composite layers, comprising:
    a composite material formed on a substrate, the composite material is consisted of a metal layer, a first metal nitride layer, and a DLC thin film, wherein;
    the metal layer is consisted of aluminum (Al), copper (Cu), zirconium (Zr), nickel (Ni), or vanadium (V); and
    the metal nitride layer is consisted of aluminum nitride (Al—N), zirconium nitride (Zr—N), vanadium nitride (V—N), or nickel nitride (Ni—N).

2. The structural material of DLC composite layers according to claim 1, wherein the metal layer is an aluminum (Al) layer, and the metal nitride layer is an Al—N layer.

3. The structural material of DLC composite layers according to claim 1, wherein the structural material of DLC composite layers comprises a single layer or multiple layers of the composite material.

4. The structural material of DLC composite layers according to claim 3, further comprising a second metal nitride layer, between the multiple layers of the composite material.

5. The structural material of DLC composite layers according to claim 4, wherein the second metal nitride layer comprises aluminum nitride (Al—N), zirconium nitride (Zr—N), vanadium nitride (V—N), or nickel nitride (Ni—N).

6. The structural material of DLC composite layers according to claim 4, wherein a thickness of the second metal nitride layer is 20 nm-100 nm.

7. The structural material of DLC composite layers according to claim 1, wherein the DLC thin film in the composite material comprises pure carbon or a tetragonally bonded amorphous carbon (ta-C) structure containing less than 10% of hydrogen atom, nitrogen atom, or metal atom.

8. The structural material of DLC composite layers according to claim 1, wherein thicknesses of the metal layer and the first metal nitride layer in the composite material are 20 nm-100 nm respectively.

9. The structural material of DLC composite layers according to claim 1, wherein a thickness of the DLC thin film in the composite material is 100 nm-10 μm.

10. The structural material of DLC composite layers according to claim 1, wherein the substrate comprises a metal substrate or a non-metal substrate.

11. A structural material of DLC composite layers, comprising:
a composite material consisted of a metal nitride layer and a DLC thin film, wherein;
the metal nitride layer is consisted of aluminum nitride (Al—N), zirconium nitride (Zr—N), vanadium nitride (V—N), or nickel nitride (Ni—N), and a thickness of the metal nitride layer is 20 nm-100 nm.

12. The structural material of DLC composite layers according to claim 11, wherein the metal nitride layer is an Al—N layer.

13. The structural material of DLC composite layers according to claim 11, wherein the structural material of DLC composite layers comprises a single layer or multiple layers of the composite material.

14. The structural material of DLC composite layers according to claim 11, further comprising a metal layer, between the composite material and a metal substrate.

15. The structural material of DLC composite layers according to claim 14, wherein the metal layer is consisted of aluminum (Al), copper (Cu), zirconium (Zr), nickel (Ni), or vanadium (V).

16. The structural material of DLC composite layers according to claim 14, wherein a thickness of the metal layer is 20 nm-100 nm.

17. The structural material of DLC composite layers according to claim 11, wherein the DLC thin film in the composite material comprises pure carbon or a tetragonally bonded amorphous carbon (ta-C) structure containing less than 10% of hydrogen atom, nitrogen atom, or metal atom.

18. The structural material of DLC composite layers according to claim 11, wherein a thickness of the DLC thin film in the composite material is 100 nm-10 μm.

* * * * *